(12) United States Patent
Yamada et al.

(10) Patent No.: US 10,243,568 B2
(45) Date of Patent: Mar. 26, 2019

(54) SEMICONDUCTOR DEVICE, CONTROL SYSTEM, AND SYNCHRONIZATION METHOD

(71) Applicant: Renesas Electronics Corporation, Tokyo (JP)

(72) Inventors: Hiromichi Yamada, Tokyo (JP); Akihiro Yamate, Tokyo (JP); Hitoshi Suzuki, Tokyo (JP); Yoichi Yuyama, Tokyo (JP); Teppei Hirotsu, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/797,033

(22) Filed: Oct. 30, 2017

(65) Prior Publication Data

US 2018/0159540 A1   Jun. 7, 2018

(30) Foreign Application Priority Data

Dec. 5, 2016   (JP) .................................. 2016-235943

(51) Int. Cl.
 *H03K 21/40* (2006.01)
 *H03K 21/38* (2006.01)
(52) U.S. Cl.
 CPC .......... *H03K 21/406* (2013.01); *H03K 21/38* (2013.01)
(58) Field of Classification Search
 CPC ................................................... H03K 21/406
 See application file for complete search history.

(56) References Cited

U.S. PATENT DOCUMENTS 5,907,699 A * 5/1999 Nakajima ................ G06F 1/04
                                                        713/501

FOREIGN PATENT DOCUMENTS

| JP | 2015-173414 A | 10/2015 |
| JP | 2016-013044 A | 1/2016 |
| JP | 2016-013045 A | 1/2016 |

\* cited by examiner

*Primary Examiner* — Daniel Puentes
(74) *Attorney, Agent, or Firm* — Sughrue Mion, PLLC

(57) ABSTRACT

In a system for performing clock generation for each semiconductor device, synchronization between the semiconductor devices is achieved without causing a count value in a counter to be discontinuously changed. A semiconductor device 1 includes a clock oscillator 2, a counter 3 configured to count the number of clocks, a periodic register 4 in which a value corresponding to a period for synchronization is set, a comparison circuit 5 configured to compare the count value in the counter 3 with the set value in the periodic register 4, a match flag register 6 in which a predetermined value is set when the count value coincides with the set value, a match output terminal 7 configured to output the value in the match flag register 6 from the own semiconductor device, a match input terminal 8 to which a value output from another semiconductor device to be synchronized is input, and a reset circuit configured to reset the counter 3 and the match flag register 6 when both the value in the match flag register 6 of the own semiconductor device and the value input to the match input terminal 8 become a predetermined value.

14 Claims, 14 Drawing Sheets

SEMICONDUCTOR DEVICE, CONTROL SYSTEM, AND SYNCHRONIZATION METHOD

CROSS-REFERENCE TO RELATED APPLICATIONS

This application is based upon and claims the benefit of priority from Japanese patent application No. 2016-235943, filed on Dec. 5, 2016, the disclosure of which is incorporated herein in its entirety by reference.

BACKGROUND

The present invention relates to a semiconductor device, a control system, and a synchronization method and can be suitably used, for example, for a semiconductor device including a counter.

Methods for achieving synchronization between two semiconductor devices have been known.

Japanese Unexamined Patent Application Publication No. 2015-173414 discloses an electronic control apparatus for achieving synchronization between two semiconductor devices, a main device and a sub device. In the electronic control apparatus, the main and sub semiconductor devices each include a timer. In the synchronization method disclosed in Japanese Unexamined Patent Application Publication No. 2015-173414, the main device outputs a synchronous signal to the sub device when the value of the timer has reached a predetermined value and the sub device causes the value of the timer that it includes to be synchronized with the value of the timer of the main device in accordance with this synchronous signal. In this electronic control apparatus, an oscillator is attached to the main device to generate clocks. These clocks are input to the sub device. That is, the clock source in the main device is the same as that in the sub device.

Japanese Unexamined Patent Application Publication No. 2016-13044 discloses a method in which an operation timing adjustment unit outputs a signal for synchronization to two devices and the two devices correct timers included therein to a predetermined value in accordance with the synchronous signal.

Japanese Unexamined Patent Application Publication No. 2016-13045 discloses a method in which a Pulse Width Modulation (PWM) signal generated by a main device is input to a sub device, the sub device obtains a difference between a time of a rising edge of the PWM signal that has been input thereto and a time of a rising edge of a PWM signal that the sub device has generated, and the sub device corrects a timer for generating the PWM signal.

SUMMARY

In the technique disclosed in Japanese Unexamined Patent Application Publication No. 2015-173414, the main device and the sub device use one clock source. In this case, when a failure occurs in an oscillator or a clock oscillation circuit of the main device, both the main device and the sub device cannot be operated. On the other hand, in the techniques disclosed in Japanese Unexamined Patent Application Publication Nos. 2016-13044 and 2016-13045, the two devices use clocks different from each other. In this case, even when a failure occurs in the oscillator or the clock oscillation circuit of one of the two devices, the other device can be operated. However, in the technique disclosed in Japanese Unexamined Patent Application Publication No. 2016-13044, the operation timing adjustment unit outputs the synchronous signal irrespective of the timer values of the two devices (i.e., the count values of the counters). Therefore, when synchronization is performed, the timer values of the two devices are discontinuously changed. Further, in the technique disclosed in Japanese Unexamined Patent Application Publication No. 2016-13045, the timer of the sub device is corrected in such a way as to coincide with the timer of the main device. Therefore, when synchronization is performed, the timer value of the sub device is discontinuously changed.

Therefore, a technique for achieving, in a system in which clock generation is performed for each semiconductor device, synchronization between the semiconductor devices without causing the count value in the counter to be discontinuously changed, is still being required.

The other objects or problems solved by the present invention and the novel characteristics of the present invention will be made apparent from the descriptions of the specification or the accompanying drawings.

According to one embodiment, a semiconductor device includes a clock oscillator, a counter configured to count the number of clocks, a match flag register in which a predetermined value is set when the count value coincides with the set value, a match output terminal configured to output the value in the match flag register from the own semiconductor device, a match input terminal to which a value output from another semiconductor device to be synchronized is input, and a reset circuit configured to reset the counter and the match flag register when both the value in the match flag register of the own semiconductor device and the value input to the match input terminal become a predetermined value.

According to the embodiment, it is possible to achieve, in a system in which clock generation is performed for each semiconductor device, synchronization between semiconductor devices without causing the count value in the counter to be discontinuously changed.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
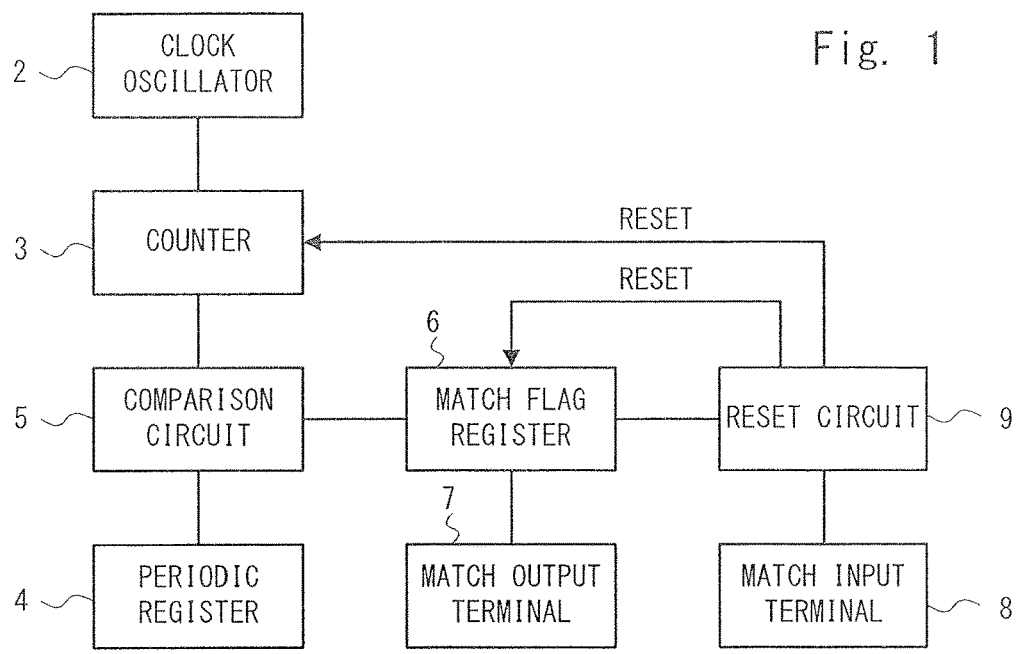
FIG. 1 is a block diagram showing one example of a configuration of a semiconductor device according to an outline of embodiments.

For the sake of clarity of descriptions, the following descriptions and drawings are omitted and simplified as appropriate. In the drawings, the same elements are denoted by the same reference signs, and repetitive descriptions will be avoided as necessary.

OUTLINE OF EMBODIMENTS

Prior to giving the description of embodiments in detail, an outline of the embodiments will be described first. FIG. 1 is a block diagram showing one example of a configuration of a semiconductor device 1 according to the outline of the embodiments. As shown in FIG. 1, the semiconductor device 1 includes a clock oscillator 2, a counter 3, a periodic register 4, a comparison circuit 5, a match flag register 6, a match output terminal 7, a match input terminal 8, and a reset circuit 9.

The clock oscillator 2 generates clocks. The counter 3 counts the number of clocks generated by the clock oscillator 2. The periodic register 4 is a register in which a value corresponding to a period for synchronization with another semiconductor device to be synchronized is set. The comparison circuit 5 is a circuit that compares the count value in the counter 3 and the set value in the periodic register 4. The match flag register 6 is a register in which a predetermined value is set when the count value in the counter 3 and the set value in the periodic register 4 coincide with each other. The match output terminal 7 is a terminal that outputs the value in the match flag register 6 from the own semiconductor device (the semiconductor device 1). The match input terminal 8 is a terminal to which the value output from another semiconductor device to be synchronized is input. The reset circuit 9 is a circuit that resets the counter 3 and the match flag register 6 when both the value in the match flag register 6 of the own semiconductor device (the semiconductor device 1) and the value input to the match input terminal 8 become the aforementioned predetermined value.

The other semiconductor device to be synchronized also includes a configuration similar to that of the semiconductor device 1. That is, the other semiconductor device to be synchronized includes, similar to the semiconductor device 1, the clock oscillator 2, the counter 3, the periodic register 4, the comparison circuit 5, the match flag register 6, the match output terminal 7, the match input terminal 8, and the reset circuit 9.

The match input terminal 8 of the semiconductor device 1 receives the value in the match flag register 6 of the other semiconductor device output from the match output terminal 7 of the other semiconductor device to be synchronized. Therefore, when the count value in the counter 3 of the semiconductor device 1 reaches the set value in the periodic register 4 and the count value in the counter 3 of the other semiconductor device to be synchronized also reaches this set value, the counter 3 of the semiconductor device 1 is reset. At this time, the counter 3 of the other semiconductor device to be synchronized is also reset.

As described above, the semiconductor device 1 includes the clock oscillator 2. Accordingly, according to the semiconductor device 1, it is possible to constitute a system in which the clock generation is performed for each semiconductor device. That is, it is possible to constitute a redundant system regarding clock generation. Further, the counter 3 is reset after the counter 3 of each of the semiconductor device 1 and the other semiconductor device to be synchronized has counted up to a set value. Therefore, both the semiconductor device 1 and the other semiconductor device to be synchronized are able to continuously continue counting until the time when the count value in the counter 3 reaches the set value. Accordingly, according to the semiconductor device 1, in a system for performing clock generation for each semiconductor device, it is possible to achieve synchronization between the semiconductor devices without the count value in the counter 3 being discontinuously changed.

The continuity of the count values will be described. In this description, "the count value is continuously changed" means that the count value in the counter is changed from a predetermined first value to a predetermined second value in order without skipping any value. Further, "the count value is discontinuously changed" means that the count value in the counter is changed, with any one of the values between the predetermined first value and the predetermined second value being skipped.

The aforementioned point will be described further in detail. It is assumed, in this example, that the value set in the periodic register 4 is N and the count value in the counter 3 is reset to 0 for the sake of convenience of description. In this case, the counter 3 is not reset unless it counts up to N. Therefore, it is guaranteed that the counter 3 counts the values from 0 to N in order. Accordingly, it is possible to achieve synchronization without the count value being discontinuously changed.

First Embodiments

Figure 2:
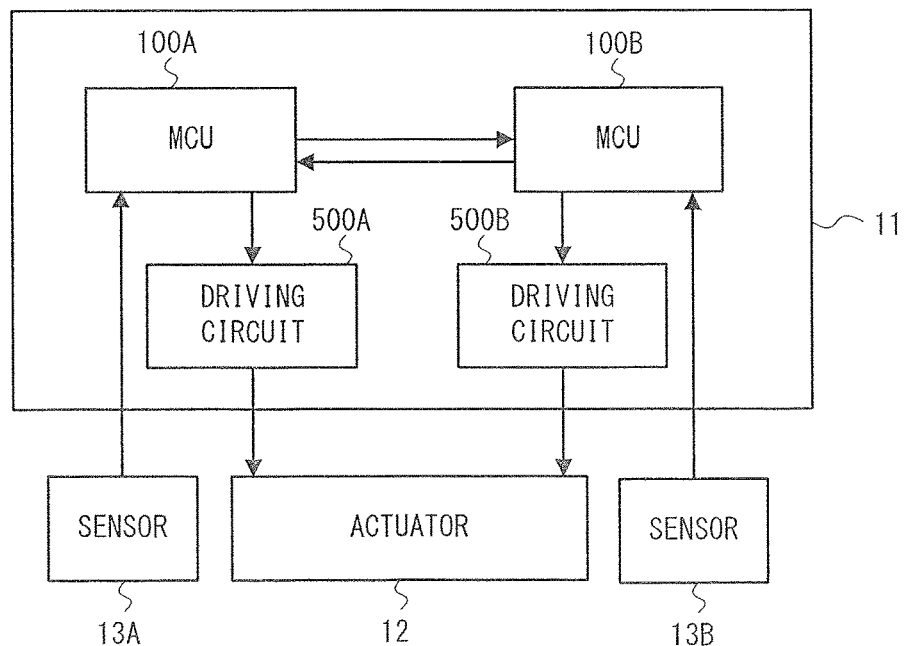
FIG. 2 is a block diagram showing a configuration example of a control system according to the embodiments.

Next, the details of the embodiments will be described. FIG. 2 is a block diagram showing a configuration example of a control system 10 according to the first embodiment. As shown in FIG. 2, the control system 10 includes a control unit 11, an actuator 12, and sensors 13A and 13B. The control unit 11 includes an MCU 100A as a first semiconductor device, an MCU 100B as a second semiconductor device, and driving circuits 500A and 500B. As described above, the control system 10 has a redundant configuration. That is, the control system 10 is a control system having two systems including a first system in which the actuator 12 is controlled by the MCU 100A, the driving circuit 500A, and the sensor 13A and a second system, in which the actuator 12 is controlled by the MCU 100B, the driving circuit 500B, and the sensor 13B. In the following description, the MCU 100A and the MCU 100B may be simply referred to as an MCU 100 when they are not differentiated from each other.

In this embodiment, the actuator 12 is a motor and includes a first winding wire for the first system and a second winding wire for the second system. The control system 10 is, for example, an electric power steering system and assists a steering wheel operation of vehicles by power generated by the actuator 12. The actuator 12 is not limited to being a motor and may be another control target.

The Micro Controller Unit (MCU) 100A is a semiconductor device configured to receive data from the sensor 13A and outputs a control signal to the driving circuit 500A. Further, the MCU 100A outputs a match signal to the MCU 100B. In a similar way, the MCU 100B is a semiconductor device configured to receive data from the sensor 13B and outputs a control signal to the driving circuit 500B. Further, the MCU 100B outputs a match signal to the MCU 100A. The MCUs 100A and 100B exchange the match signals, to thereby make the values of the counters for generating the control signals coincide with each other periodically. Accordingly, the MCUs 100A and 100B generate the control signals based on the count values while mutually synchronizing the count values. In this embodiment, the control signal is a PWM signal. The details of the MCUs 100A and 100B will be described later in detail.

The driving circuits 500A and 500B each drive the actuator 12. The driving circuit 500A generates a drive signal for driving the actuator 12 based on the control signal from the MCU 100A and outputs the drive signal to the actuator 12. The drive signal generated by the driving circuit 500A is a drive signal for the first winding wire of the actuator 12. The driving circuit 500B generates a drive signal for driving the actuator 12 based on the control signal from the MCU 100B and outputs the drive signal to the actuator 12. The drive signal generated by the driving circuit 500B is a drive signal for the second winding wire of the actuator 12. Accordingly, the actuator 12 may be driven by the control of both the first system and the second system or may be driven by any one of the control by the first system and the control by the second system.

The sensors 13A and 13B sense the state of the actuator 12. In this embodiment, the sensors 13A and 13B are sensors that sense the location of a rotor of a motor, and are, for example, encoders. The data sensed by the sensor 13A is input to the MCU 100A. The data sensed by the sensor 13B is input to the MCU 100B. It is therefore possible to perform a feedback control.

Figure 3:
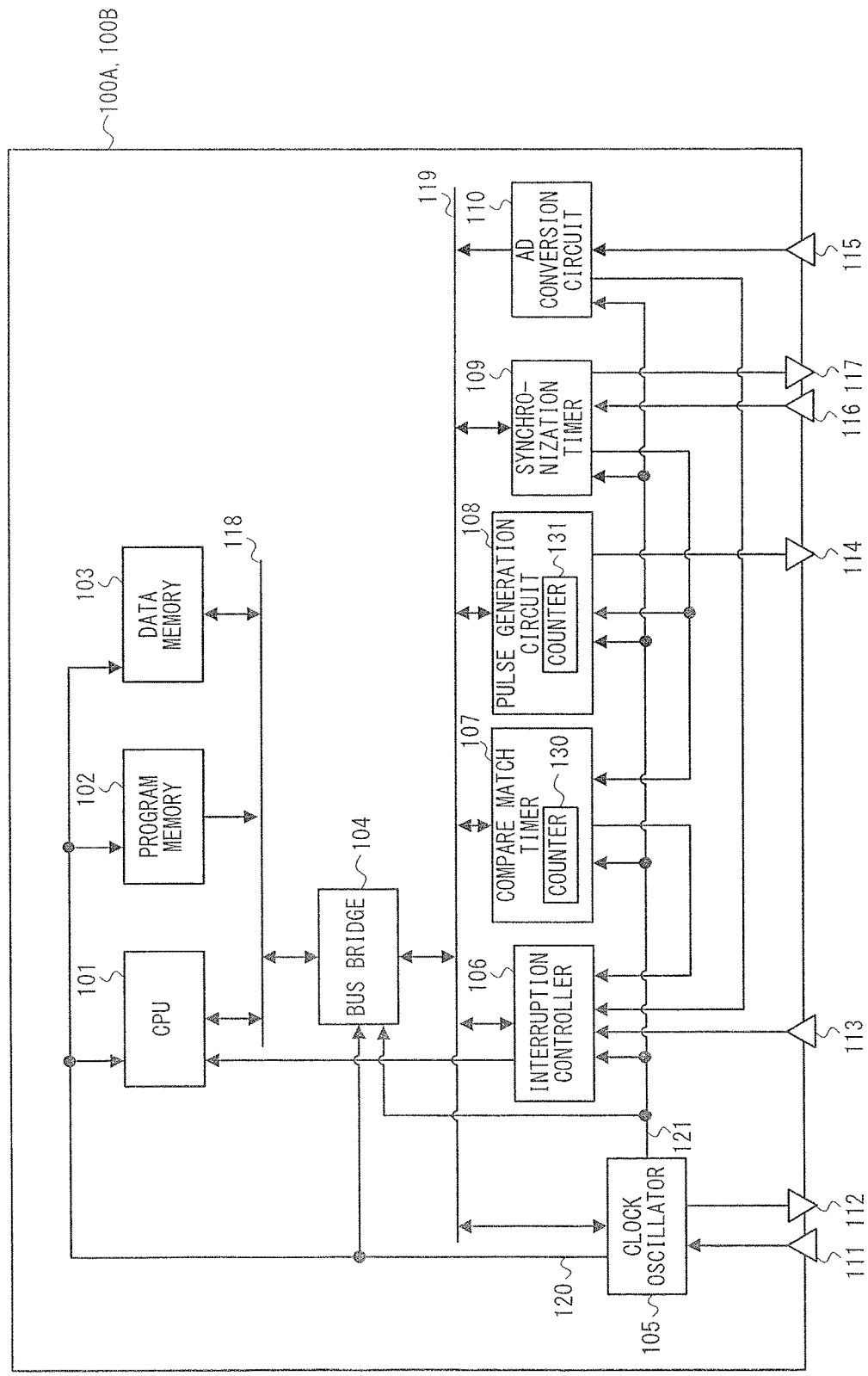
FIG. 3 is a block diagram showing one example of a configuration of an MCU according to a first embodiment.

Next, the details of the MCUs 100A and 100B will be described. FIG. 3 is a block diagram showing one example of the configuration of the MCUs 100A and 100B according to this embodiment.

The MCUs 100A and 100B each include a Central Processing Unit (CPU) 101, a program memory 102, a data memory 103, a bus bridge 104, a clock oscillator 105, an interruption controller 106, a compare match timer 107, a pulse generation circuit 108, a synchronization timer 109, and an AD conversion circuit 110. Further, the MCUs 100A and 100B each include, as input/output terminals for input and output with external devices, a clock input terminal 111, a clock output terminal 112, an interruption input terminal 113, a pulse output terminal 114, a sensor input terminal 115, a match input terminal 116, and a match output terminal 117.

The CPU 101 loads a program from the program memory 102 via a CPU bus 118 and executes the loaded program. Further, the CPU 101 performs data access via the CPU bus 118 for the data memory 103 by executing the program. Further, the CPU 101 is able to access the clock oscillator 105, the interruption controller 106, the compare match timer 107, the pulse generation circuit 108, the synchronization timer 109, and the AD conversion circuit 110 connected to a peripheral bus 119 via the bus bridge 104. Therefore, various processes are achieved by the execution of the program by the CPU 101.

The aforementioned program can be stored and provided to a computer using any type of non-transitory computer readable media. Non-transitory computer readable media include any type of tangible storage media. Examples of non-transitory computer readable media include magnetic storage media (such as flexible disks, magnetic tapes, hard disk drives, etc.), optical magnetic storage media (e.g., magneto-optical disks), Compact Disc Read Only Memory (CD-ROM), CD-R, CD-R/W, and semiconductor memories (such as mask ROM, Programmable ROM (PROM), Erasable PROM (EPROM), flash ROM, Random Access Memory (RAM), etc.). The program(s) may be provided to a computer using any type of transitory computer readable media. Examples of transitory computer readable media include electric signals, optical signals, and electromagnetic waves. Transitory computer readable media can provide the program to a computer via a wired communication line (e.g., electric wires, and optical fibers) or a wireless communication line.

The program memory 102 is a memory that stores the program executed by the CPU 101. The data memory 103 is a memory that stores data read out by the CPU 101 and data to be written by the CPU 101.

The bus bridge 104 decodes a command and an address on the CPU bus 118. When it is determined that the result of the decoding shows a command for a peripheral circuit connected to the peripheral bus 119, the bus bridge 104 accesses the peripheral bus 119 by output ting the command and the address to the peripheral bus 119. When the access is a read access, the bus bridge 104 outputs the read data read out by the peripheral bus 119 to the CPU bus 118 and causes the CPU 101 to perform reading. When the access is a write access, the bus bridge 104 outputs the write data in the CPU bus 118 to the peripheral bus 119 and causes the peripheral circuit to perform writing.

The clock oscillator 105 is connected to the clock input terminal 111 and the clock output terminal 112 to which an oscillator (not shown) is connected, and generates clocks. The clock oscillator 105 generates a CPU clock 120 and a peripheral clock 121. The CPU clock 120 is input to the CPU 101, the program, memory 102, the data memory 103, and the bus bridge 104. The peripheral clock 121 is input to the bus bridge 104, the interruption controller 106, the compare match timer 107, the pulse generation circuit 108, the synchronization timer 109, and the AD conversion circuit 110.

The interruption controller 106 selects an input interruption request in accordance with a priority order and outputs an interruption signal to the CPU 101. In this embodiment, the interruption request may be input to the interruption controller 106 from the interruption input terminal 113, the compare match timer 107, and the AD conversion circuit 110. An interruption request from an external device is input to the interruption input terminal 113.

The compare match timer 107 includes a counter 130. When the count value in the counter 130 coincides with a predetermined value, the compare match timer 107 outputs the interruption request to the interruption controller 106. Therefore, the interruption signal is input to the CPU 101 from the interruption controller 106. In this case, the CPU 101 refers to the count value in the compare match timer 107 and executes the processing in accordance with this count value (that is, the aforementioned predetermined value).

The pulse generation circuit 108 includes a counter 131, generates a pulse signal (PWM signal), which is a control signal for the driving circuit 500A or the driving circuit 500B using the count value in the counter 131, and outputs the pulse signal from the pulse output terminal 114. When the count value in the counter 131 coincides with a preconfigured first duty value, the pulse generation circuit 108 switches the pulse output from ON to OFF. When the count value in the counter 131 coincides with a preconfigured second duty value, the pulse generation circuit 108 switches the pulse output from OFF to ON. That is, the count value in the counter 131 corresponds to a carrier wave in the PWM control. The pulse signal output from the pulse output terminal 114 of the MCU 100A is input to the driving circuit 500A and the pulse signal output from the pulse output terminal 114 of the MCU 100B is input to the driving circuit 500B. Further, the pulse generation circuit 108 may be called a control signal generation circuit.

The synchronization timer 109 includes a counter 150. When a predetermined condition is satisfied, the synchronization timer 109 resets the counter 150. Further, in this embodiment, when the synchronization timer 109 resets the counter 150, it resets the counter 130 of the compare match timer 107 and the counter 131 of the pulse generation circuit 108 at the same time. When the count value in the counter 150 coincides with the set value, the synchronization timer 109 outputs the match signal indicating that the values coincide with each other via the match output terminal 117. Further, the synchronization timer 109 receives the match signal output from the match output terminal 117 of the other MCU via the match input terminal 116. That is, the match signal output from the match output terminal 117 of the MCU 100B is input to the synchronization timer 109 of the MCU 100A and the match signal output from the match output terminal 117 of the MCU 100A is input to the synchronization timer 109 of the MCU 100B.

The AD conversion circuit 110 converts an analog signal input to the sensor input terminal 115 into a digital signal. When the conversion is completed, the AD conversion circuit 110 outputs the interruption request to the interruption controller 106. Therefore, the interruption signal is input to the CPU 101 from the interruption controller 106. In this case, the CPU 101 acquires the result of the conversion in the AD conversion circuit 110. Note that the sensor input terminal 115 of the MCU 100A is connected to the sensor 13A and the data sensed by the sensor 13A is input. Further, in a similar way, the sensor input terminal 115 of the MCU 100B is connected to the sensor 13B and the data sensed by the sensor 13B is input.

Figure 4:
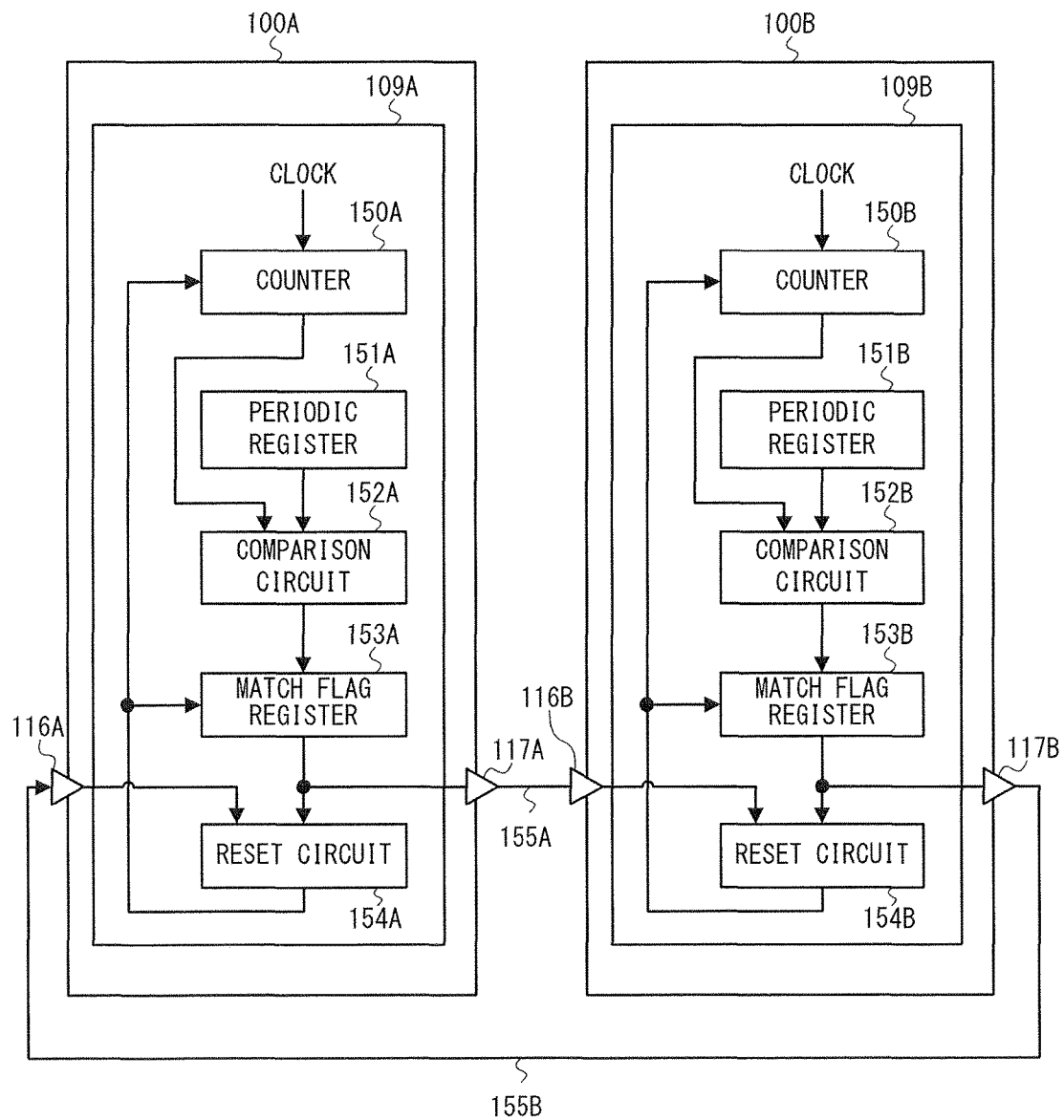
FIG. 4 is a block diagram showing one example of a configuration of a synchronization timer according to the first embodiment.

Next, the details of the synchronization timer 109 will be described. FIG. 4 is a block diagram showing one example of the configuration of the synchronization timer 109 according to this embodiment. FIG. 4 shows the configuration of the synchronization timer 109 of the MCU 100A and the configuration of the synchronization timer 109 of the MCU 100B, and the connection relation thereof. The synchronization timer 109 includes a counter 150, a periodic register 151, a comparison circuit 152, a match flag register 153, and a reset circuit 154.

In FIG. 4, the components that belong to the MCU 100A and the components that belong to the MCU 100B are differentiated from each other by attaching "A" after the numerals such as a synchronization timer 109A for the components that belong to the MCU 100A and attaching "B" after the numerals such as a synchronization timer 109B for the components that belong to the MCU 100B. In the following descriptions, the components may be differentiated from each other in a similar way.

The counter 150 corresponds to the counter 3 shown in FIG. 1. The counter 150 receives the peripheral clock 121 generated by the clock oscillator 105 and counts the peripheral clock 121. That is, the counter 150A counts the clock generated by the clock oscillator 105 of the MCU 100A and the counter 150B counts the clock generated by the clock oscillator 105 of the MCU 100B. While the counter 150 performs counting by incrementing the value by one from 0 in this embodiment, the counter 150 may perform counting by decrementing the value. Further, the counter 150 resets the count value to "0" when the reset signal from the reset circuit 154 described later becomes "1".

The periodic register 151 corresponds to the periodic register 4 in FIG. 1. The periodic register 151 is a register in which a value corresponding to the period for synchronization in the MCU 100A and the MCU 100B is set. It may also be said that the periodic register 151 is a register that stores a set value defining the range of the values in which it is guaranteed that the continuous counting is performed. The CPU 101 of the MCU 100A writes the set value into the periodic register 151A and the CPU 101 of the MCU 100B writes the set value into the periodic register 151B.

The comparison circuit 152 corresponds to the comparison circuit 5 shown in FIG. 1. The comparison circuit 152 compares the count value in the counter 150 with the set value set in the periodic register 151 and outputs the value indicating the result of the comparison to the match flag register 153. Specifically, the comparison circuit 152A compares the count value in the counter 150A with the value in the periodic register 151A. When it is determined that these values coincide with each other, the value indicating it is stored in the match flag register 153A. In a similar way, the comparison circuit 152B compares the count value in the counter 150B with the value in the periodic register 151B. When it is determined that these values coincide with each other, the value indicating it is stored in the match flag register 153B. In this embodiment, until the time when the count value coincides with the set value in the periodic register, the match flag register 153 stores "0". When the values coincide with each other, the match flag register 153 stores "1". These values are merely examples and other values may be used.

The match flag register 153 corresponds to the match flag register 6 in FIG. 1. The match flag register 153 is a register in which a predetermined value is set when the count value in the counter 150 coincides with the set value in the periodic register 151. That is, specifically, when the count value in the counter 150 coincides with the set value in the periodic register 151, the match flag register 153 is set to "1" by the comparison circuit 152. Further, the value in the match flag register 153 is reset to "0" when the reset signal from the reset circuit 154 described later becomes "1".

Further, the value set in the match flag register 153 is externally output as the match signal. That is, the value set in the match flag register 153A is output from the match output terminal 117A of the MCU 100A and is input to the match input terminal 116B of the MCU 100B. In a similar way, the value set in the match flag register 153B is output from the match output terminal 117B of the MCU 100B and is input to the match input terminal 116A of the MCU 100A. Therefore, the match output terminal 117A of the MCU 100A and the match input terminal 116B of the MCU 100B are connected to each other by a signal line 155A and the match output terminal 117B of the MCU 100B and the match input terminal 116A of the MCU 100A are connected to each other by a signal line 155B. In this way, the match input terminal 116 receives the match signal output from another MCU 100 to be synchronized and the match output terminal 117 outputs the value in the match flag register 153 from the own semiconductor device to the other MCU 100 to be synchronized. Further, the match output terminal 117 corresponds to the aforementioned match output terminal 7 and the match input terminal 116 corresponds to the aforementioned match input terminal 8.

The reset circuit 154 corresponds to the reset circuit 9 shown in FIG. 1. The reset circuit 154 is a circuit for resetting, when the value in the match flag register 153 and the value input to the match input terminal 116 both become a predetermined value, the counter 150 and the match flag register 153. Specifically, when the value in the match flag register 153 and the value input to the match input terminal 116 both become "1", the reset circuit 154 resets the counter 150 and the match flag register 153. When the reset circuit 154 executes reset processing, it sets the reset signal to "1", and otherwise, it sets the reset signal to "0". In this embodiment, when both the value in the match flag register 153 and the value input to the match input terminal 116 become a predetermined value, the reset circuit 154 also resets the counter 130 of the compare match timer 107 and the counter 131 of the pulse generation circuit 108. The reset circuit 154 resets them by setting the reset signal to "1" for only one clock cycle.

Figure 5:
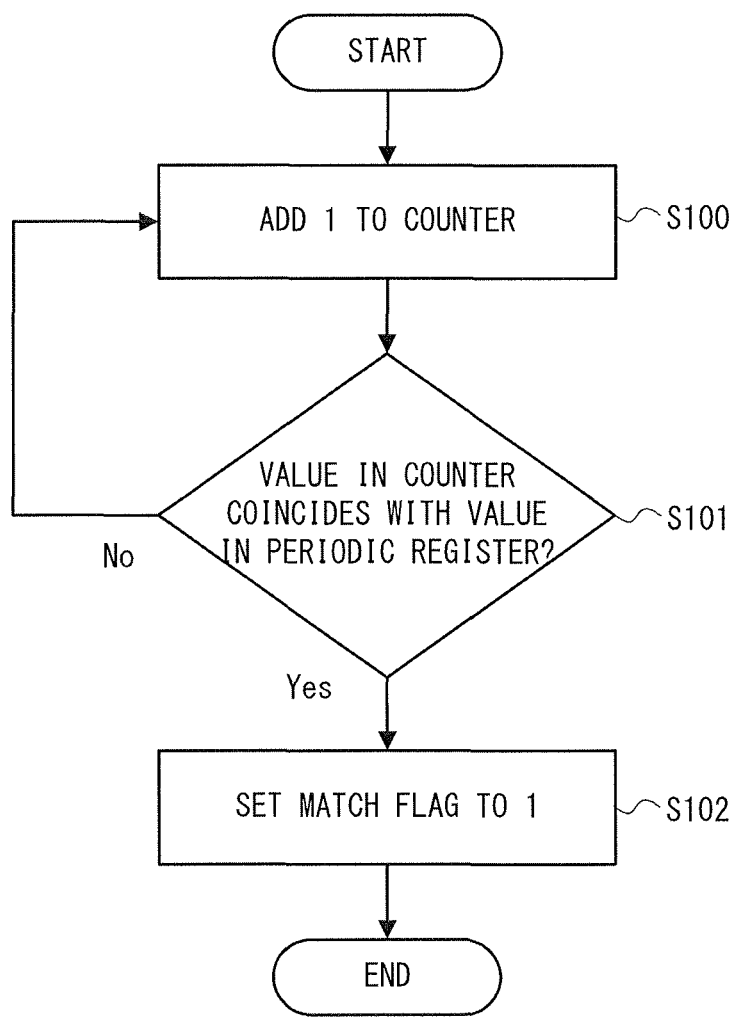
FIG. 5 is a flowchart showing one example of set processing of a match flag register of the synchronization timer according to the first embodiment.

FIG. 5 is a flowchart showing one example of the set processing of the match flag register 153 of the synchronization timer 109. In the following description, with reference to FIG. 5, the set processing of the match flag register 153 will be described.

In Step 100 (S100), the peripheral clock 121 is changed from "0" to "1", whereby the counter 150 adds the count value by one and updates the count value.

In Step 101 (S101), the comparison circuit 152 checks whether the count value in the counter 150 has coincided with the set value in the periodic register 151. When these values coincide with each other, the process moves to Step 102. When these values do not coincide with each other, the process goes back to Step 100.

In Step 102 (S102), the comparison circuit 152 sets "1" in the match flag register 153.

Figure 6:
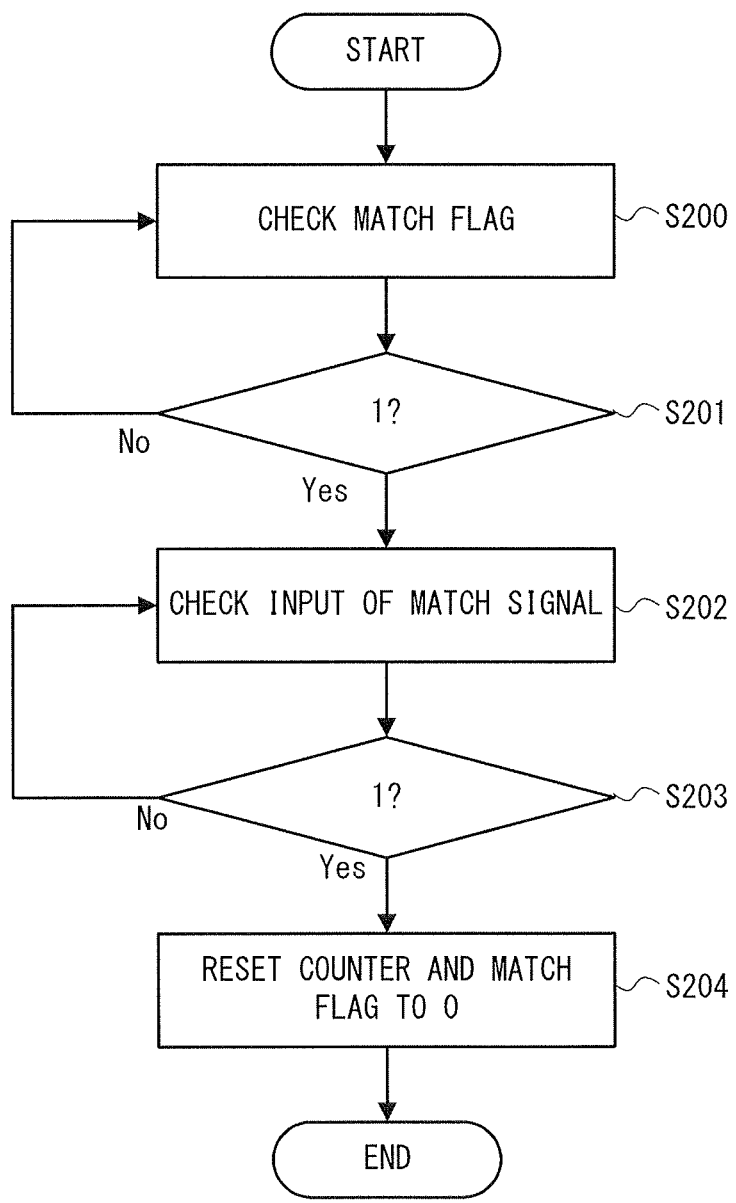
FIG. 6 is a flowchart showing one example of reset processing by a reset circuit according to the first embodiment.

FIG. 6 is a flowchart showing one example of the reset processing by the reset circuit 154. In the following description, with reference to FIG. 6, an operation of the reset circuit 154 will be described.

In Step 200 (S200), the reset circuit 154 checks the value in the match flag register 153. When the value set in the match flag register 153 is "1" (Yes in Step 201 (S201)), the process moves to Step 202. When the value is not "1" (No in Step 201), the process goes back to Step 200.

In Step 202 (S202), the reset circuit 154 checks the match signal input to the match input terminal 116. When the input match signal is "1" (Yes in Step 203 (S203)), the process moves to Step 204. When the input match signal is not "1" (No in Step 203), the process goes back to Step 202.

In Step 204 (S204), the reset circuit 154 resets the counter 150 of the synchronization timer 109, the counter 130 of the compare match timer 107, the counter 131 of the pulse generation circuit 108, and the match flag register 153 of the synchronization timer 109 to "0".

Figure 7:
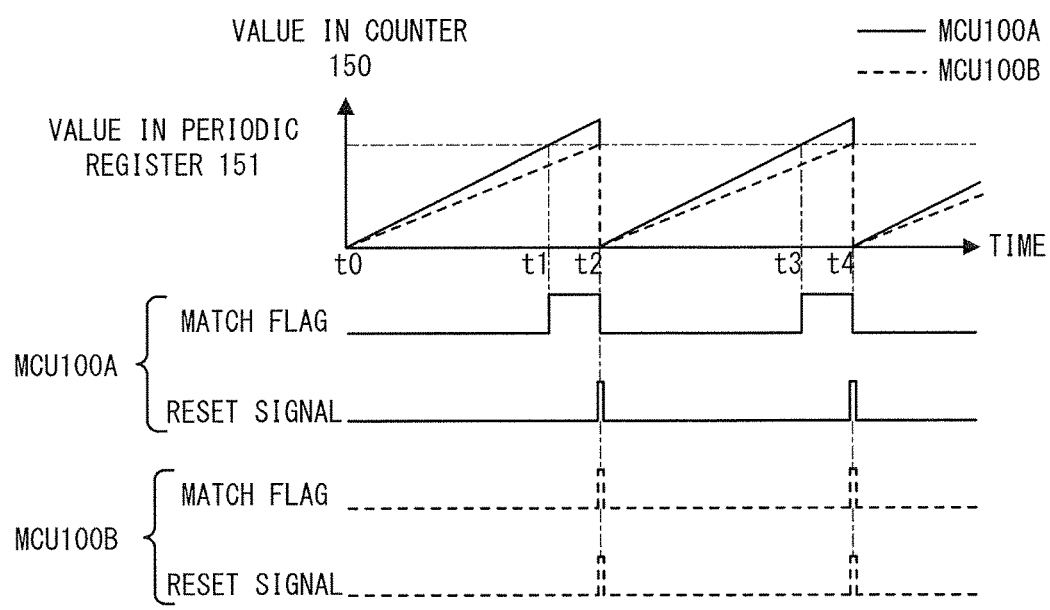
FIG. 7 is a timing chart showing a synchronous operation of a counter of a synchronization timer according to the first embodiment.

FIG. 7 is a timing chart showing the synchronous operation of the counter 150 of the synchronization timer 109. FIG. 7 shows, from up to bottom, the temporal transition of the value in the counter 150, the value in the match flag register 153A of the MCU 100A, the reset signal of the MCU 100A, the value in the match flag register 153B of the MCU 100B, and the reset signal of the MCU 100B. In FIG. 7, solid lines are used for the MCU 100A and dashed lines are used for the MCU 100B.

It is assumed that the value in the counter 150 in the MCU 100A and that in the MCU 100B are both "0" at time t0. In this example, as one example, it is assumed that the period of the peripheral clock 121 of the MCU 100A is shorter than that of the peripheral clock 121 of the MCU 100B. Therefore, FIG. 7 shows a state in which, while the value in the counter 150 increases with time, the value in the counter 150A of the MCU 100A becomes larger than the value in the counter 150B of the MCU 100B. Such a deviation occurs since there is an error between the period of the peripheral clock 121 of the MCU 100A and the period of the peripheral clock 121 of the MCU 100B. This error occurs since the oscillator connected to the MCU 100A differs from the oscillator connected to the MCU 100B and further the MCUs 100A and 100B generate clocks by clock oscillators 105 different from each other.

At time t1, the value in the counter 150A of the MCU 100A coincides with the value in the periodic register 151A and "1" is set in the match flag register 153A of the MCU 100A.

At time t2, the value in the counter 150B of the MCU 100B coincides with the value in the periodic register 151B and "1" is set in the match flag register 153B of the MCU 100B. The values of the match flag registers 153 of the MCU 100A and the MCU 100B are sent from the match output terminal 117 to the counterpart match input terminal 116. Therefore, the reset signal becomes "1". Accordingly, the counter 150 and the match flag register 153 of the MCUs 100A and 100B are reset to "0". In this embodiment, in this case, the counter 130 of the compare match timer 107 and the counter 131 of the pulse generation circuit 108 of the MCU 100A and the MCU 100B are also reset.

At time t3, the operation similar to the operation performed at time t1 is performed, and at time t4, the operation similar to the operation performed at time t2 is performed. Accordingly, at time t4, reset processing is performed.

The first embodiment has been described above. According to this embodiment, the MCU 100A outputs whether the count value in the counter 150A has reached the set value to the MCU 100B and the MCU 100B also outputs whether the count value in the counter 150B has reached the set value to the MCU 100A. When both the count value in the counter 150A and the count value in the counter 150B reach the set value, the MCU 100A resets the counter 150A. In a similar way, when both the count value in the counter 150A and the count value in the counter 150B reach the set value, the MCU 100B resets the counter 150B. Accordingly, it is possible to synchronize the counter 150A of the synchronization timer 109A of the MCU 100A with the counter 150B of the synchronization timer 109B of the MCU 100B. The counters 150A and 150B are not reset unless the count value reaches the set value in the periodic register 151. Therefore, it is guaranteed that the counters 150A and 150B count from 0 to this set value in order. Accordingly, it is possible to achieve synchronization of the counter 150 without causing the count value in the counter 150 to be discontinuously changed.

Further, in this embodiment, when the counter 150 of the synchronization timer 109 is reset, the counter 130 of the compare match timer 107 and the counter 131 of the pulse generation circuit 108 are also reset. Accordingly, as for the counters 130 and 131 as well, synchronization is achieved between the MCU 100A and the MCU 100B. Further, these counters are also not reset unless the count value reaches the set value in the periodic register 151. Therefore, it is guaranteed that the counters 130 and 131 perform counting in order from 0 to the set value. Accordingly, for these counters as well, it is possible to achieve synchronization without causing the count value to be discontinuously changed.

As described above, the CPU 101 executes processing in accordance with the set value when the count value in the compare match timer 107 becomes the set value. Accordingly, when the count value in the compare match timer 107 is discontinuously changed by resetting for synchronization, it is possible that the processing that should be performed by interruption may not be executed. On the other hand, in this embodiment, it is possible to achieve synchronization without causing the count value to be discontinuously changed, whereby it is guaranteed that the processing that should be performed by interruption is executed.

Further, the pulse generation circuit 108 switches ON and OFF of the PWM signal depending on whether the count value and duty value coincide with each other. Therefore, when the count value in the pulse generation circuit 108 is discontinuously changed by resetting for synchronization, it is possible that the PWM signal may not be correctly switched ON or OFF. On the other hand, in this embodiment, it is possible to achieve synchronization without causing the count value to be discontinuously changed, whereby it is guaranteed that the PWM signal is correctly switched ON or OFF.

Further, in this embodiment, the pulse generation circuit 108 generates the control signal based on the count value in the counter 131 reset at the same timing as the count value in the counter 150. That is, the pulse generation circuit 108 of the MCU 100A and the pulse generation circuit 108 of the MCU 100B each generate the control signal based on the synchronized count value. Accordingly, in this embodiment, the first system and the second system are able to control the actuator 12 in a coordinated manner.

Second Embodiments

Next, a second embodiment will be described. In the first embodiment, the compare match timer 107 includes the counter 130 reset by the reset signal in the synchronization timer 109 and the pulse generation circuit 108 includes the counter 131 reset by the reset signal in the synchronization timer 109. The second embodiment differs from the first embodiment in that the compare match timer and the pulse generation circuit use the count value in the counter 150 of the synchronization timer 109.

Figure 8:
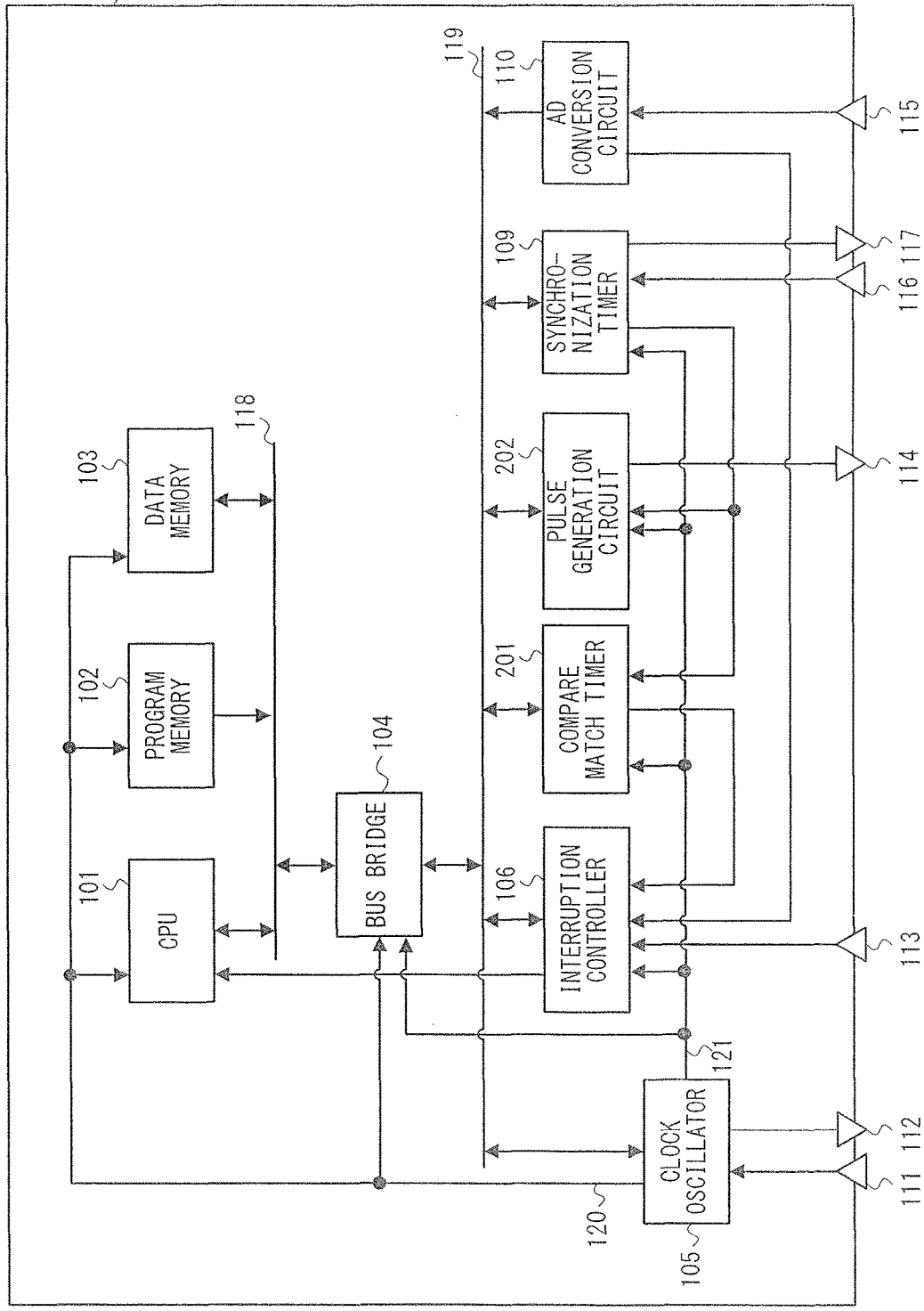
FIG. 8 is a block diagram showing one example of a configuration of an MCU according to a second embodiment.

FIG. 8 is a block diagram showing one example of the configuration of MCUs 200A and 200B according to this embodiment. The MCUs 200A and 200B differ from the MCUs 100A and 100B in that the MCUs 200A and 200B each include a compare match timer 201 in place of the compare match timer 107 and include a pulse generation circuit 202 in place of the pulse generation circuit 108.

The compare match timer 201 differs from the compare match timer 107 in that it sends the interruption request using the count value input from the counter 150 of the synchronization timer 109. The compare match timer 201 outputs, similar to the compare match timer 107, the interruption request to the interruption controller 106 when the count value coincides with the set value. In this way, the compare match timer 201 needs not include a counter. Accordingly, the configuration of the compare match timer 201 can be made simple. Further, the count value used by the compare match timer 201 can be synchronized without being discontinuously changed, whereby the execution of the processing that should be performed by interruption is guaranteed, similar to the first embodiment.

The pulse generation circuit 202 generates, similar to the pulse generation circuit 108, the pulse signal (PWM signal), which is the control signal for the driving circuit 500A or the driving circuit 500B, and outputs the pulse signal from the pulse output terminal 114. However, the pulse generation circuit 202 generates the control signal using the count value in the counter 150 of the synchronization timer 109. That is, when the count value in the counter 150 coincides with the preconfigured first duty value, the pulse generation circuit 202 switches the pulse output from ON to OFF. When the count value in the counter 150 coincides with the preconfigured second duty value, the pulse generation circuit 202 switches the pulse output from OFF to ON. The pulse generation circuit 202 is also referred to as a control signal generation circuit. The pulse generation circuit 202 needs not include a counter. Therefore, the configuration of the pulse generation circuit 202 can be made simple. Further, it is possible to achieve synchronization without causing the count value used by the pulse generation circuit 202 to be discontinuously changed, whereby it is guaranteed that the PWM signal is correctly switched ON or OFF, similar to the first embodiment.

Further, in this embodiment, the pulse generation circuit 202 generates the control signal based on the count value in the counter 150. That is, each of the pulse generation circuit 202 of the MCU 200A and the pulse generation circuit 202 of the MCU 200B generates the control signal based on the synchronized count value. Accordingly, in this embodiment as well, the first system and the second system are able to control the actuator 12 in a coordinated manner.

While the configuration in which the count value in the counter 150 of the synchronization timer 109 is used for both the compare match timer and the pulse generation circuit has been described in this embodiment, only one of them may have this configuration and the other one of them may have the configuration as shown in the first embodiment.

Third Embodiment

Figure 9:
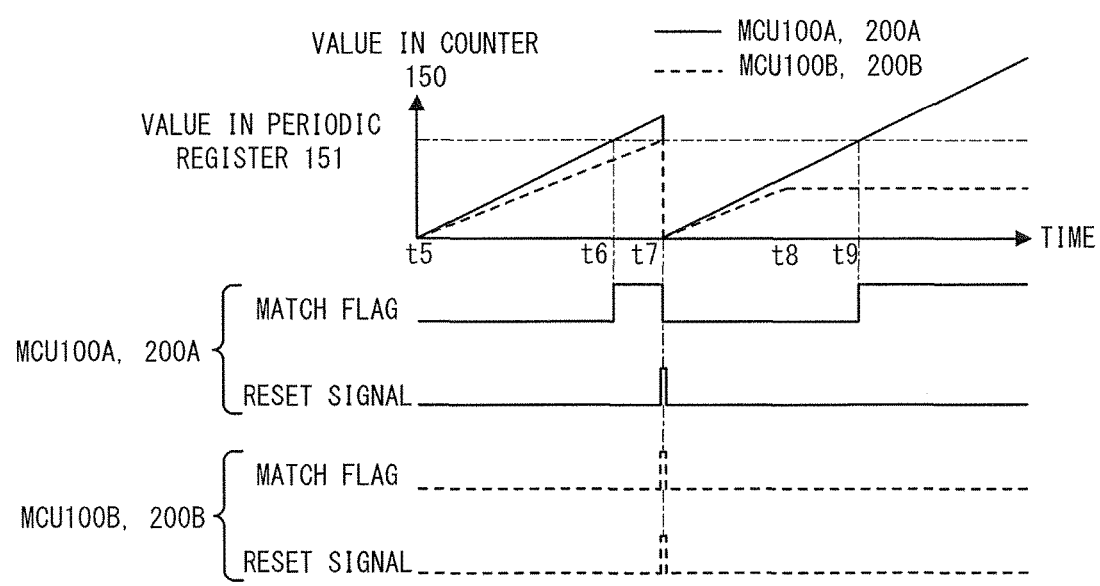
FIG. 9 is a timing chart showing one example of an abnormal operation of a counter.

Prior to giving description of a third embodiment, a problem that may occur in the first embodiment or the second embodiment will be described. FIG. 9 is a timing chart showing one example of an abnormal operation of the counter 150. FIG. 9 shows, from up to bottom, the temporal transition of the value in the counter 150, the value in the match flag register 153A of the MCU 100A or the MCU 200A, the reset signal of the MCU 100A or 200A, the value in the match flag register 153B of the MCU 100B or 200B, and the reset signal of the MCU 100B or 200B. In FIG. 9, solid lines are used for the MCU 100A or 200A and dashed lines are used for the MCU 100B or 200B. In FIG. 9, time t5 to time t7 are the same as time t0 to time t2 or time t2 to time t4 in FIG. 7.

It is assumed, at time t8, that the counter 150 of the MCU 100B (the MCU 200B) has stopped counting due to some reason. At time t9, the value in the counter 150 of the MCU 100A (the MCU 200A) coincides with the value in the periodic register 151 and "1" is set in the match flag register 153 of the MCU 100A (the MCU 200A). While the counter 150 of the MCU 100A (the MCU 200A) continues counting at and after time t9, the counter 150 is not reset since the counter 150 of the MCU 100B (the MCU 200B) is stopped.

In the aforementioned embodiments, when the synchronization timer 109 included in the MCU 100A (the MCU 200A) and the synchronization timer 109 included in the MCU 100B (the MCU 200B) are normal, the counter 150 is periodically reset and synchronization thereof is achieved. However, when one of the synchronization timers 109 becomes abnormal, there is a problem that the normal synchronization timer 109 is not reset. Strictly speaking, the count value counted by the counter 150 is reset when the count value reaches a limit value in terms of the design. However, even in this case, the normal synchronization timer 109 needs to continue counting until the count value reaches the limit value in terms of the design. That is, when an abnormality occurs in one of the synchronization timers 109, the normal synchronization timer 109 cannot be reset in a desired period any more. This may lead to a problem in terms of the control such as a problem that the occurrence of the interruption request by the compare match timer cannot be performed in a desired period.

This embodiment shows a configuration in which, when an abnormality of the synchronization timer 109 has been detected, the synchronization processing is terminated and the asynchronous counting and resetting by the normal synchronization timer 109 are performed. To be more specific, in this embodiment, the synchronization timer 109 according to the first embodiment or the second embodiment is replaced by a synchronization timer 301. That is, the MCU 300 according to this embodiment differs from the MCU 100 according to the first embodiment or the MCU 200 according to the second embodiment in that the synchronization timer 109 is replaced by the synchronization timer 301.

Figure 10:
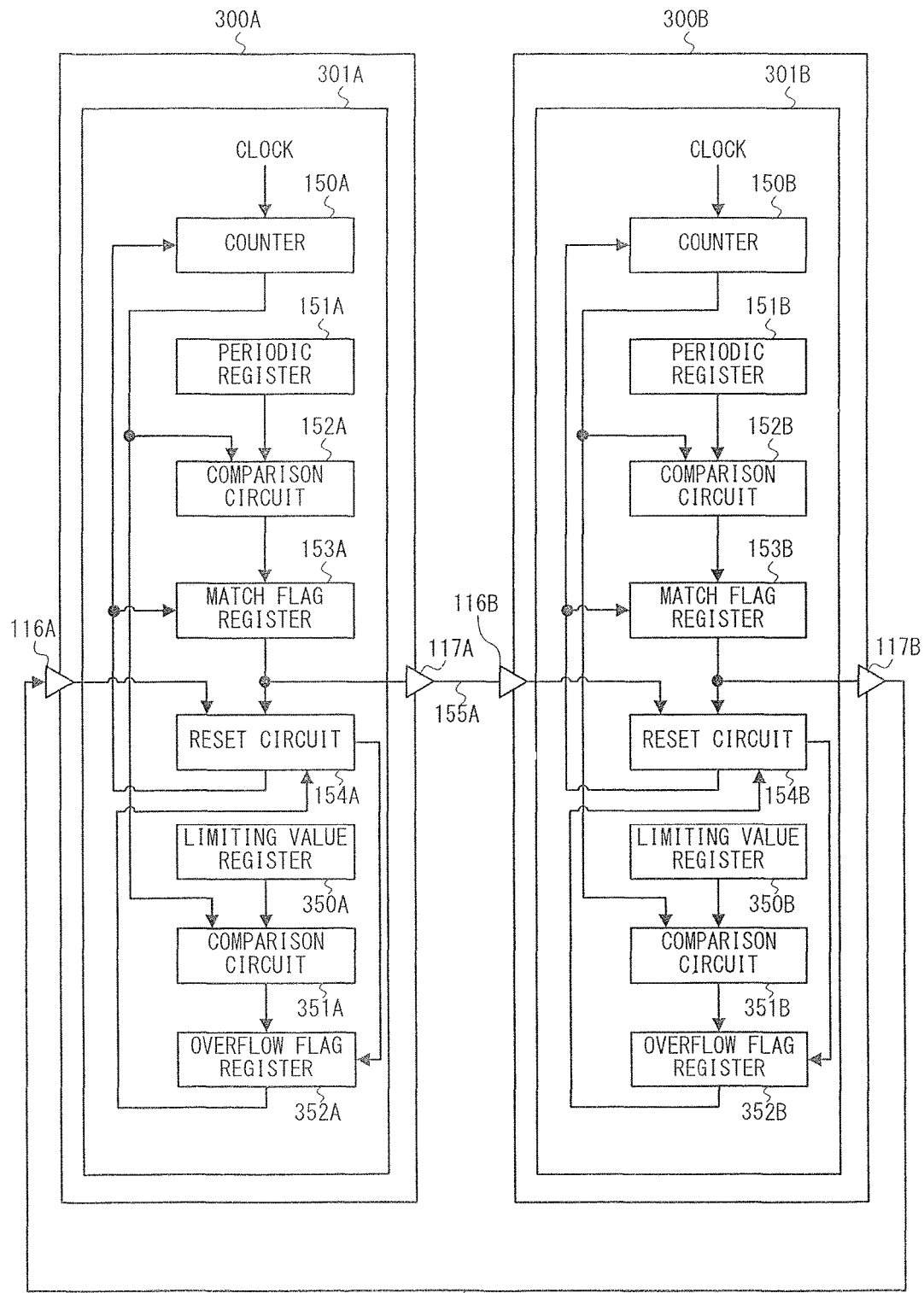
FIG. 10 is a block diagram showing one example of a configuration of a synchronization timer according to a third embodiment.

FIG. 10 is a block diagram showing one example of the configuration of the synchronization timer 301 according to the third embodiment. FIG. 10 shows, similar to FIG. 4, the configuration of the synchronization timer 301 of the MCU 300A and the configuration of the synchronization timer 301 of the MCU 300B, and the connection relation thereof. The synchronization timer 301 includes, similar to the synchronization timer 109, the counter 150, the periodic register 151, the comparison circuit 152, the match flag register 153, and the reset circuit 154. Further, the synchronization timer 301 further includes a limiting value register 350, a comparison circuit 351, and an overflow flag register 352.

In FIG. 10 as well, the components that belong to the MCU 300A and the components that belong to the MCU 300B are differentiated from each other by attaching "A" after the numerals such as a synchronization timer 301A for the components that belong to the MCU 300A and attaching "B" after the numerals such as a synchronization timer 301B for the components that belong to the MCU 300B. In the following descriptions, the components may be differentiated from each other in a similar way.

The limiting value register 350 is a register in which the limiting value of the number of clocks counted by the counter 150 is set. This limiting value is a limit value counted by the counter 150. In this embodiment, the counter 150 performs counting by incrementing the value by one from 0. Therefore, the limit value is an upper-limit value that the counter 150 counts. The absolute value of the limiting value set in the limiting value register 350 is smaller than the absolute value of the limit value that can be counted by the counter 150 in view of design. The CPU 101 of the MCU 300A writes the set value in the limiting value register 350A. The CPU 101 of the MCU 300B writes the set value in the limiting value register 350B.

The comparison circuit 351 is a circuit that compares the count value in the counter 150 with the limiting value set in the limiting value register 350. The comparison circuit 351 compares the count value with the limiting value and outputs the value indicating the result of the comparison to the overflow flag register 352. Specifically, the comparison circuit 351A compares the count value in the counter 150A with the value in the limiting value register 350A. When it is determined that these values coincide with each other, the value indicating it is stored in the overflow flag register 352A. In a similar way, the comparison circuit 351B compares the count value in the counter 150B with the value in the limiting value register 350B. When it is determined that these values coincide with each other, the value indicating it is stored in the overflow flag register 352B. In this embodiment, before the count value and the limiting value coincide with each other, the overflow flag register 352 stores "0". When the count value and the limiting value coincide with each other, the overflow flag register 352 stores "1". These values are merely examples and other values may be used.

Further, when the count value in the counter 150 coincides with the limiting value set in the limiting value register 350, the comparison circuit 351 outputs the interruption request to the interruption controller 106. That is, when, for example, the count value in the counter 150A coincides with the limiting value set in the limiting value register 350A, the comparison circuit 351A outputs the interruption request to the interruption controller 106 of the MCU 300A. When the interruption request is input to the interruption controller 106, the interruption signal is input to the CPU 101 from the Interruption controller 106. In this case, the CPU 101 refers to the value in the overflow flag register 352. When it is confirmed that "1" is stored in the overflow flag register 352, the control mode is switched to the control in one system. That is, the CPU 101 switches processing in such a way as to control the actuator 12 by only one MCU 300. In this way, in this embodiment, when the value in the overflow flag register 352 is set to "1", the interruption request due to it is output. Therefore, the normal MCU 300 is able to sense the abnormality of the synchronization partner and to switch to the processing in accordance therewith.

The overflow flag register 352 is a register in which a predetermined value is set when the count value in the counter 150 coincides with the limiting value in the limiting value register 350. That is, specifically, when the count value in the counter 150 and the limiting value set in the limiting value register 350 coincide with each other, the overflow flag register 352 is set to "1" by the comparison circuit 351. Further, the overflow flag register 352 is reset to "0" when the match signal input from the match input terminal 116 becomes "1". In other words, the overflow flag register 352 is reset when the value input from the match input terminal 116 becomes a predetermined value. Further, the set value in the overflow flag register 352 is input to the reset circuit 154.

When the value in the overflow flag register 352 of the own semiconductor device is other than the aforementioned predetermined value, the reset circuit 154 according to this embodiment performs reset processing in accordance with the reset condition similar to that in the first or second embodiment. That is, the reset circuit 154 according to this embodiment performs reset processing at a timing when both the value in the match flag register 153 of the own semiconductor device and the value of the match signal input from the match input terminal 116 have become a predetermined value (specifically, when the value thereof is "1") in the state in which the value in the overflow flag register 352 is other than the predetermined value (specifically, when the value thereof is "0").

Further, the reset circuit 154 according to this embodiment performs reset processing at the timing when the value in the overflow flag register 352 of the own semiconductor device has become a predetermined value (specifically, "1"). Further, the reset circuit 154 according to this embodiment performs reset processing at a timing when the value in the match flag register 153 of the own semiconductor device has become a predetermined value (specifically, "1") in the state in which the value in the overflow flag register 352 of the own semiconductor device is the predetermined value (specifically, when the value thereof is "1").

Accordingly, in this embodiment, when the value in the overflow flag register 352A is "0", for example, when both the value in the match flag register 153A and the value in the match input terminal 116A become "1", the reset circuit 154A sets the reset signal to "1" for only one clock cycle. Otherwise, the reset circuit 154A sets the reset signal to "0". Further, the reset circuit 154A sets the reset signal to "1" for only one clock cycle at the timing when the value in the overflew flag register 352A has become "1". Then, while the value in the overflow flag register 352A remains to be "1," the reset circuit 154A sets the reset signal to "1" for only one clock cycle when the value in the match flag register 153A becomes "1".

When the compare match timer and the pulse generation circuit are configured as shown in the first embodiment, the reset circuit 154 according to this embodiment resets, besides resetting the counter 150 and the match flag register 153, the counter 130 and the counter 131.

Further, the reset circuit 154 according to this embodiment resets the value in the overflow flag register 352 to "0" when the match signal input from the match input terminal 116 becomes "1".

Figure 11:
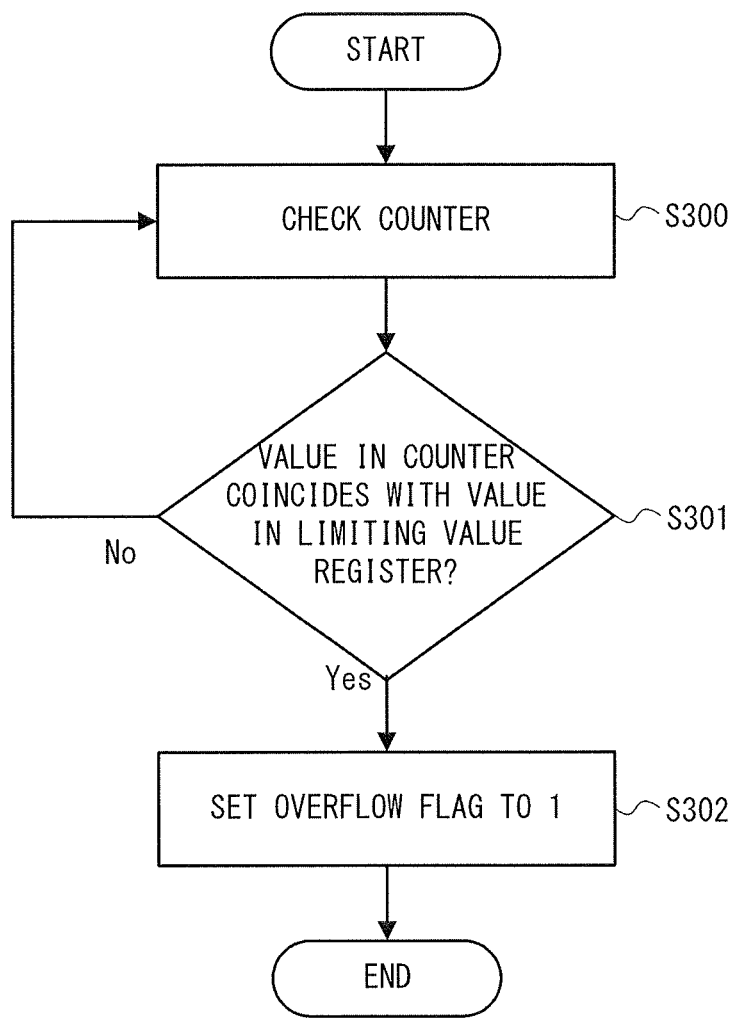
FIG. 11 is a flowchart showing one example of set processing of an overflow flag register of the synchronization timer according to the third embodiment.

FIG. 11 is a flowchart showing one example of set processing of the overflow flag register 352 of the synchronization timer 301 according to the third embodiment. In the following description, with reference to FIG. 11, the set processing of the overflow flag register 352 will be described.

In Step 300 (S300), the comparison circuit 351 checks whether the count value in the counter 150 has coincided with the set value in the limiting value register 350. When the values coincide with each other (Yes in Step 301 (S301)), the process moves to Step 302. When they do not coincide with each other (No in Step 301), the process goes back to Step 300.

In Step 302 (S302), the comparison circuit 351 sets "1" in the overflow flag register 352.

Figure 12:
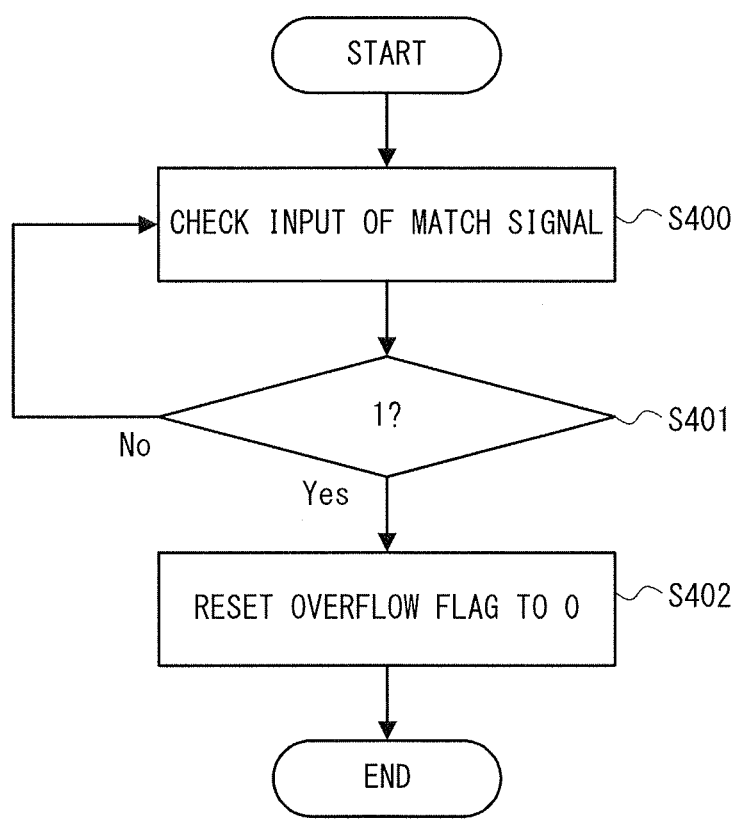
FIG. 12 is a flowchart showing one example of reset processing of the overflow flag register according to the third embodiment.

FIG. 12 is a flowchart showing one example of the reset processing of the overflow flag register 352. In the following description, with reference to FIG. 12, the operation of the reset processing of the overflow flag register 352 will be described.

In Step 400 (S400), the reset circuit 154 checks the match signal input to the match input terminal 116. When the value of the match signal is "1" (Yes in Step 401 (S401)), the process moves to Step 402. When the value thereof is not "1" (No in Step 401), the process goes back to Step 400.

In Step 402 (S402), the reset circuit 154 resets the overflow flag register 352 to "0".

Figure 13:
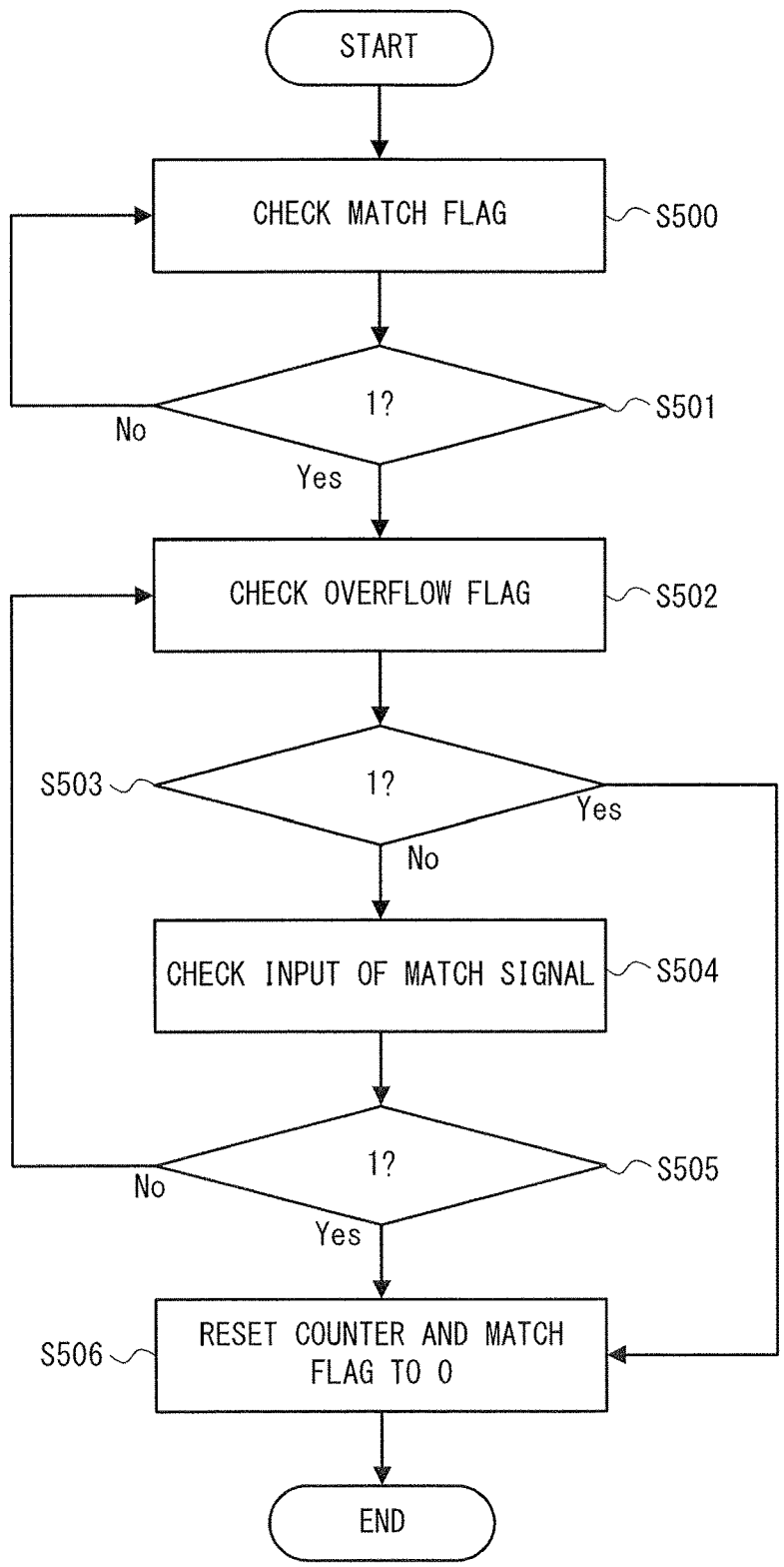
FIG. 13 is a flowchart showing one example of reset processing of a counter and a match flag register according to the third embodiment.

FIG. 13 is a flowchart showing one example of the reset processing of the counter 150 and the match flag register 153. In the following description, with reference to FIG. 13, the reset operations thereof will be described.

In Step 500 (S500), the reset circuit 154 checks the value in the match flag register 153. When the value set in the match flag register 153 is "1" (Yes in Step 501 (S501)), the process moves to Step 502. When the value is not "1" (No in Step 501), the process goes back to Step 500.

In Step 502 (S502), the reset circuit 154 checks the value in the overflow flag register 352. When the value set in the overflow flag register 352 is "1" (Yes in Step 503 (S503)), the process moves to Step 506. When the value is not "1" (No in Step 503), the process moves to Step 504.

In Step 504 (S504), the reset circuit 154 checks the match signal input to the match input terminal 116. When the input match signal is "1" (Yes in Step 505 (S505)), the process moves to Step 506. When the input match signal is not "1" (No in Step 505), the process goes back to Step 502.

In Step 506 (S506), the reset circuit 154 resets the counter 150 of the synchronization timer 109 and the match flag register 153 of the synchronization timer 109 to "0". When the compare match timer and the pulse generation circuit are configured as shown in the first embodiment, the reset circuit 154 also resets the counter 130 and the counter 131 to "0".

Figure 14:
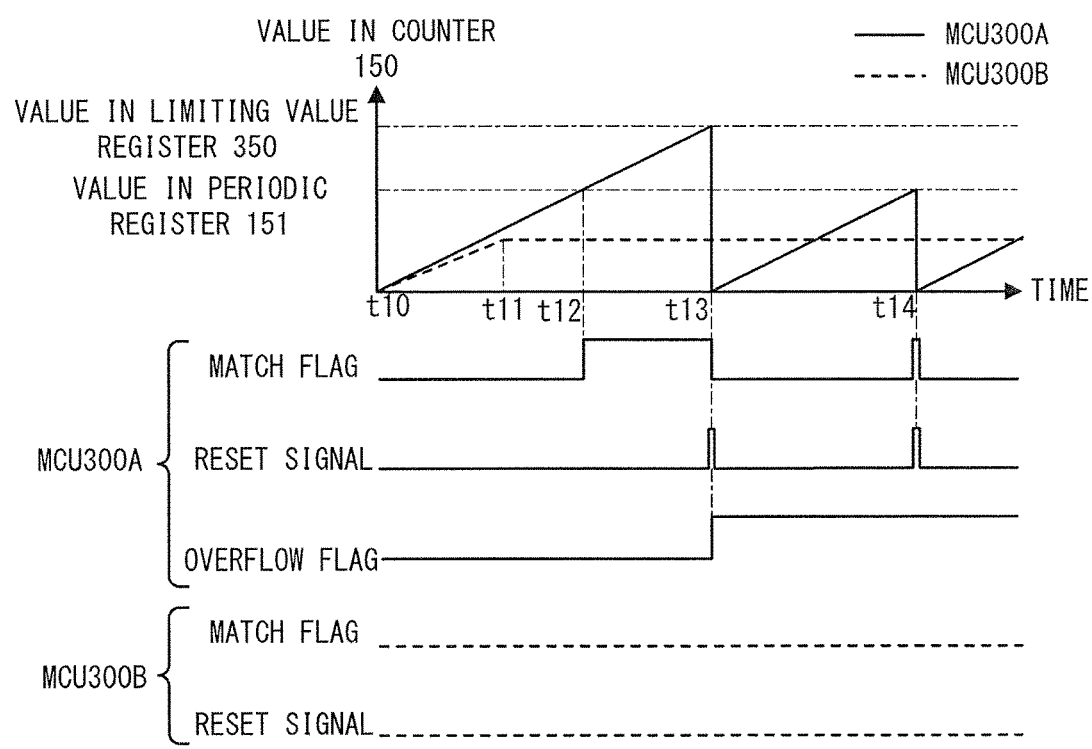
FIG. 14 is a timing chart showing one example of asynchronous operations of a counter when an abnormality occurs in a synchronization timer of a synchronization partner.
Figure 15:
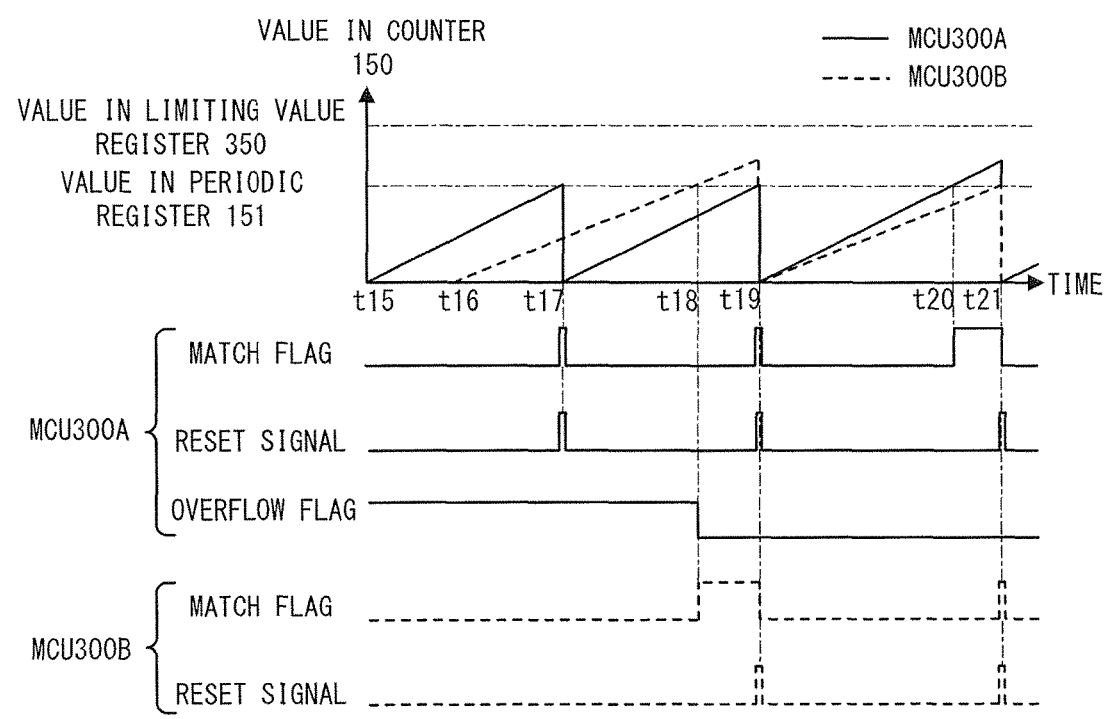
FIG. 15 is a timing chart showing one example of synchronous operations after the asynchronous operations of the counter.

FIG. 14 is a timing chart showing one example of the asynchronous operation of the counter 150 when an abnormality occurs in the synchronization timer 301 of the synchronization partner. FIG. 14 and FIG. 15 described later show, from up to bottom, the temporal transition of the value in the counter 150, the value in the match flag register 153A of the MCU 300A, the reset signal of the MCU 300A, the value in the overflow flag register 352A of the MCU 300A, the value in the match flag register 153B of the MCU 300B, and the reset signal of the MCU 300B. In FIGS. 14 and 15, solid lines are used for the MCU 300A and dashed lines are used for the MCU 300B.

It is assumed that the value in the counter 150 in the MCU 300A and that in the MCU 300B are both "0" at time t10. While the value in the counter 150 increases with time, at time t11, an abnormality occurs in the MCU 300B, and the counter 150B stops counting.

At time t12, the value in the counter 150A of the MCU 300A coincides with the value in the periodic register 151A and the match flag register 153A of the MCU 300A is set to "1". At time t13, the value in the counter 150A of the MCU 300A coincides with the value in the limiting value register 350A and the overflow flag register 352A of the MCU 300A is set to "1". At this time, the reset signal of the MCU 300A becomes "1" and the counter 150A and the match flag register 153A of the MCU 300A are reset to "0".

After that, at time t14, the value in the counter 150A of the MCU 300A coincides with the value in the periodic register 151A, the reset signal becomes "1", and the counter 150A and the match flag register 153A are reset to "0". After the value in the overflow flag register 352A is set to "1", the MCU 300A performs the reset processing without being synchronized with the MCU 300B at the timing when the value in the counter 150A coincides with the value in the periodic register 151A.

FIG. 15 is a timing chart showing one example of the synchronous operation after the asynchronous operation of the counter 150. At time t15, it is assumed that the value in the counter 150A of the MCU 300A is "0" and the value in the overflow flag register 352A is "1". At time t16, the counter 150B of the MCU 300B starts counting from "0". For example, the count in the counter 150B at time t16 is started due to a recovery from an abnormal state of the MCU 300B where an abnormality has temporarily occurred. The start of the count in the counter 150B at time t16 may not due to the recovery from the abnormal state and may due to the timing of starting the count in the counter 150B of the MCU 300B being later than the timing of starting the count in the counter 150A of the MCU 300A.

At time t17, the value in the counter 150A of the MCU 300A coincides with the value in the periodic register 151A, the reset signal becomes "1", and the counter 150A and the match flag register 153A are reset to "0". This reset is a reset by the asynchronous operation.

At time t18, the value in the counter 150B of the MCU 300B coincides with the value in the periodic register 151B, and the value in the match flag register 153B of the MCU 300B becomes "1". The value in the match flag register 153B of the MCU 300B is sent to the match input terminal 116A of the MCU 300A from the match output terminal 117B and the overflow flag register 352A of the MCU 300A is reset to "0".

At time t19, the value in the counter 150A of the MCU 300A coincides with the value in the periodic register 151A and the value in the match flag register 153A of the MCU 300A becomes "1". The value in the match flag register 153A of the MCU 300A is transmitted to the match input terminal 116B of the MCU 300B from the match output terminal 117A. Accordingly, in the MCUs 300A and 300B, the reset signal becomes "1" and the counter 150 and the match flag register 153 of the MCUs 300A and 300B are reset to "0". In this way, the reset processing by the synchronous operation is started.

At time t20, the value in the counter 150A of the MCU 300A coincides with the value in the periodic register 151A and the value in the match flag register 153A becomes "1". At time t21, the value in the counter 150B of the MCU 300B coincides with the value in the periodic register 151B and the value in the match flag register 153B becomes "1". Accordingly, in the MCUs 300A and 300B, the reset signal becomes "1" and the counter 150 and the match flag register 153 of the MCUs 300A and 300B are reset to "0". In this way, in the following operations, the reset processing by the synchronous operation is periodically continued.

The third embodiment has been described above. According to this embodiment, when an abnormality occurs in the synchronization partner, the operation mode can be switched to the asynchronous reset, operation at the timing when the counter 150 of the own semiconductor device has reached the set value in the limiting value register 350. That is, even when an abnormality occurs in one MCU 300, the other MCU 300 is able to perform reset processing in a desired period for the synchronization timer 109. Accordingly, the normal MCU 300 is able to continue various kinds of control that use the synchronization timer 109 of the own semiconductor device. For example, the normal MCU 300 is able to periodically generate the interruption request by the compare match timer in a desired period. In this way, the control system 10 according to this embodiment is able to perform control by one system by the normal MCU 300.

Further, in this embodiment, when the value of the match signal input to the match input terminal 116 becomes "1", the overflow flag register 352 is reset to "0". Therefore, when the counter 150 of the MCU 300A and the counter 150 of the MCU 300B are both able to perform count normally, the system is able to move to a state in which the synchronized reset operation is performed from a state in which the asynchronous reset operation is performed. Accordingly, the system is able to move to the state in which the synchronized reset operation is performed when the timing when the counter 150A of the MCU 300A starts counting differs from the timing when the counter 150B of the MCU 300B starts counting, or when one of the MCUs 300 has recovered from a failure.

While the invention made by the present inventors has been specifically described above based on the embodiments, it is needless to say that the present invention is not limited, to the embodiments already stated above and various changes can be made without departing from the spirit of the present invention.

The first to third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim, elements, even if amended later during prosecution.

What is claimed is:

1. A semiconductor device comprising:
   a clock oscillator;
   a first counter configured to count the number of clocks generated by the clock oscillator;
   a periodic register in which a value corresponding to a period for synchronization is set;
   a first comparison circuit configured to compare the count value in the first counter with the set value in the periodic register;
   a match flag register in which a first predetermined value is set when the count value in the first counter coincides with the set value in the periodic register;
   a match output terminal configured to output the value in the match flag register;
   a match input terminal to which a match signal value output from another semiconductor device to be synchronized is input; and
   a reset circuit configured to reset the first counter and the match flag register when both the value in the match flag register and the match signal value and the match signal value input to the match input terminal become the first predetermined value.

2. The semiconductor device according to claim 1, further comprising:
   a limiting value register in which a limiting value of the number of clocks counted by the first counter is set;
   a second comparison circuit configured to compare the count value in the first counter with the limiting value in the limiting value register; and
   an overflow flag register in which a second predetermined value is set when the count value in the first counter coincides with the limiting value in the limiting value register,
   wherein the reset circuit resets the first counter and the match flag register at a timing when both the value in the match flag register and the match signal value input from the match input terminal have become the first predetermined value in a state in which the value in the overflow flag register is a value other than the second predetermined value, a timing when the value in the overflow flag register has become the second predetermined value, and a timing when the value in the match flag register has become the first predetermined value in a state in which the value in the overflow flag register is the second predetermined value.

3. The semiconductor device according to claim 2, wherein the semiconductor device outputs an interruption request when the count value in the first counter coincides with the limiting value in the limiting value register.

4. The semiconductor device according to claim 2, wherein the overflow flag register is reset when the match signal value input from the match input terminal becomes the first predetermined value.

5. The semiconductor device according to claim 1, further comprising a compare match timer configured to include a second counter and output an interruption request when the count value in the second counter coincides with a predetermined value,
wherein the reset circuit resets the first counter, the match flag register, and the second counter when both the value in the match flag register and the match signal value input to the match input terminal become the first predetermined value.

6. The semiconductor device according to claim 1, further comprising a compare match timer configured to output an interruption request when the count value in the first counter coincides with a predetermined value.

7. The semiconductor device according to claim 1, further comprising a control signal generation circuit configured to include a third counter and generate a control signal using the count value in the third counter,
wherein the reset circuit resets the first counter, the match flag register, and the third counter when both the value in the match flag register and the match signal value input to the match input terminal become the first predetermined value.

8. The semiconductor device according to claim 1, further comprising a control signal generation circuit configured to generate a control signal using the count value in the first counter.

9. A control system comprising:
a first semiconductor device;
a second semiconductor device,
wherein
the first semiconductor device and the second semiconductor device each comprise:
a clock oscillator;
a counter configured to count the number of clocks generated by the clock oscillator;
a periodic register in which a value corresponding to a period for synchronization with a counterpart semiconductor device is set;
a first comparison circuit configured to compare the count value in the counter with the set value in the periodic register;
a match flag register in which a first predetermined value is set when the count value in the counter coincides with the set value in the periodic register;
a match output terminal configured to output the value in the match flag register from the own semiconductor device;
a match input terminal configured to receive the value in the match flag register of the counterpart semiconductor device output from the match output terminal of the counterpart semiconductor device;
a reset circuit configured to reset the counter and the match flag register when both the value in the match flag register of the own semiconductor device and the value input from the match input terminal become the first predetermined value; and
a control signal generation circuit configured to generate a control signal based on the count value in the counter or a count value in another counter reset at a timing the same as the timing when the counter is reset.

10. The control system according to claim 9, wherein each of the first semiconductor device and the second semiconductor device further comprises:
a limiting value register in which a limiting value of the number of clocks counted by the counter is set;
a second comparison circuit configured to compare the count value in the counter and the limiting value in the limiting value register; and
an overflow flag register in which a second predetermined value is set when the count value in the counter coincides with the limiting value in the limiting value register,
wherein the reset circuit resets the counter and the match flag register at a timing when both the value in the match flag register of the own semiconductor device and the value input from the match input terminal have become the first predetermined value in a state in which the value in the overflow flag register is a value other than the second predetermined value, a timing when the value in the overflow flag register has become the second predetermined value, and a timing when the value in the match flag register of the own semiconductor device has become the first predetermined value in a state in which the value in the overflow flag register is the second predetermined value.

11. The control system according to claim 10, further comprising:
a first driving circuit configured to drive an actuator; and
a second driving circuit configured to drive the actuator, wherein,
the control signal generation circuit of the first semiconductor device generates a control signal for the first driving circuit, and
the control signal generation circuit of the second semiconductor device generates a control signal for the second driving circuit.

12. The control system according to claim 9, further comprising:
a first driving circuit configured to drive an actuator; and
a second driving circuit configured to drive the actuator, wherein,
the control signal generation circuit of the first semiconductor device generates a control signal for the first driving circuit, and
the control signal generation circuit of the second semiconductor device generates a control signal for the second driving circuit.

13. A synchronization method, wherein
a first semiconductor device counts the number of clocks generated by a clock oscillator of the first semiconductor device by a first counter,
the first semiconductor device compares a set value corresponding to a period for synchronization with the count value in the first counter,
the first semiconductor device outputs the result of the comparison regarding whether the count value in the first counter has reached the set value to a second semiconductor device,
the second semiconductor device counts the number of clocks generated by a clock oscillator of the second semiconductor device by a second counter,
the second semiconductor device compares the set value with the count value in the second counter,
the second semiconductor device outputs the result of the comparison regarding whether the count value in the second counter has reached the set value to the first semiconductor device, the first semiconductor device resets the first counter when both the count value in the first counter and the count value in the second counter reach the set value, and the second semiconductor device resets the second counter when both the count value in the first counter and the count value in the second counter reach the set value.

14. The synchronization method according to claim 13, wherein the first semiconductor device compares a limiting value of the number of clocks counted by the first counter with the count value in the first counter, and the first counter is reset at a timing when both the count value in the first counter and the count value in the second counter have reached the set value in a state in which the count value in the first counter has not reached the limiting value, a timing when the count value in the first counter has reached the limiting value, and a timing when the count value in the first counter has reached the set value in a state in which the count value in the first counter has already reached the limiting value.

* * * * *